United States Patent
Coulter et al.

(10) Patent No.: US 6,452,375 B1
(45) Date of Patent: Sep. 17, 2002

(54) APPARATUS FOR MEASUREMENT OF CRITICAL CURRENT IN SUPERCONDUCTIVE TAPES

(75) Inventors: J. Yates Coulter; Raymond DePaula, both of Santa Fe, NM (US)

(73) Assignee: The Regents of the University of California, Los Alamos, NM (US)

( * ) Notice: Subject to any disclaimer, the term of this patent is extended or adjusted under 35 U.S.C. 154(b) by 92 days.

(21) Appl. No.: 09/615,640

(22) Filed: Jul. 13, 2000

Related U.S. Application Data (60) Provisional application No. 60/143,781, filed on Jul. 13, 1999.

(51) Int. Cl.$^7$ .............................................. G01R 19/00
(52) U.S. Cl. ................................................. 324/76.11
(58) Field of Search ............................. 324/76.11, 248, 324/201, 224, 235, 239, 262, 750, 225; 250/396 ML, 310, 311

(56) References Cited

U.S. PATENT DOCUMENTS 6,034,527 A * 3/2000 Schiller et al. ............. 324/235
6,051,839 A * 4/2000 Crewe ................. 250/396 ML

* cited by examiner

*Primary Examiner*—Safet Metjahic
*Assistant Examiner*—E P LeRoux
(74) *Attorney, Agent, or Firm*—Bruce H. Cottrell (57) ABSTRACT

A cryogenic linear positioner which is primarily used for characterizing coated conductor critical current homogeneity at 75K is disclosed. Additionally, this tool can be used to measure the positional dependence of the coated conductor resistance at room temperature, and the room temperature resistance of the underlying YBCB coating without the overlaying protective cover of silver.

9 Claims, 6 Drawing Sheets

APPARATUS FOR MEASUREMENT OF CRITICAL CURRENT IN SUPERCONDUCTIVE TAPES

RELATED APPLICATIONS

This application claims the benefit of provisional application No. 60/143,781 filed Jul. 13, 1999.

This invention was made with government support under Contract No. W-7405-ENG-36 awarded by the U.S. Department of Energy. The government has certain rights in the invention.

FIELD OF THE INVENTION

The present invention relates to an apparatus for measurement of critical current in superconductive tapes and to a method of identifying areas of superconductive tapes with lower critical current properties.

BACKGROUND OF THE INVENTION

Since their initial development, coated conductor research has focused on fabricating increasing lengths of the material, while increasing the overall critical current carrying capacity. Early samples were typically fabricated by stationary processes where the substrates were held in one position in the various deposition chambers and the various buffer layers, YBCO, and finally silver were deposited. This technique could produce samples of about 10 centimeters (cm) in length and was therefore limited. Consequently, characterization techniques focused on making one or two critical current measurements on a sample. Such coated conductor fabrication requires cryogenic testing of current carrying capacity as part of the production cycle. This measure of current carrying capacity is called "critical current" and is abbreviated as Ic, measured in Amperes.

These measurements first entailed soldering a current contact on either end of the sample using In97/3Ag (indium/silver) solder, and soldering 2 or more voltage taps spaced evenly at 1 cm intervals on the sample. The experimenter would then make an end to end measurement of the critical current by ramping the current through the sample while monitoring the voltage across the two most extreme voltage taps. The critical current was then defined as the current needed to develop a voltage of 1 $\mu$V per centimeter of sample between the two voltage contacts. Likewise, the critical current homogeneity was measured by ramping current through the entire sample while monitoring the voltage developed across consecutive pairs of voltage contacts. In 1995 this measurement technique yielded an Ic result of about 200 amperes measured across 1 cm.

Figure 1:
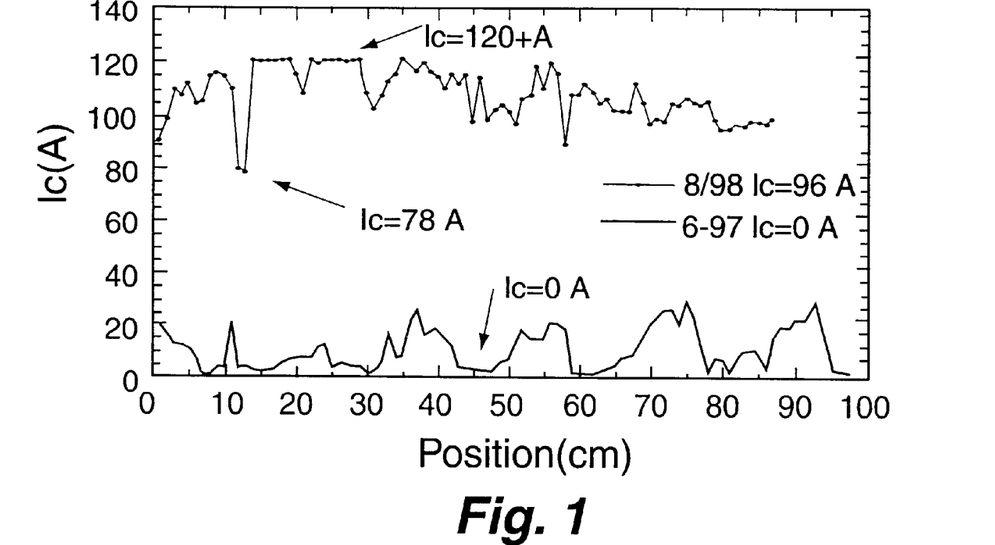
FIG. 1 shows the critical current self field homogeneity of two 1 meter long samples are shown here. The end to end Ic is determined by the worst section of the sample. Thus the 6/97 sample is resistive and the 8/98 sample had an end to end Ic of about 96 A across 86 cm. The V(I) curves for this measurement were terminated at 120 amperes to avoid destroying the inferior regions.

With the development of continuous deposition techniques, lengths up to 1.1 meters of coated conductor are now produced. The production of these longer lengths required the development of new measurement techniques. Where once, characterization was done by soldering voltage taps on the samples, problems due to the effects of soldering to the silver coating necessitated the development of solderless contacts. Concurrently, the need to characterize the longer lengths drove the measurement process to consist of not just a few Ic measurements on a scale of 1 cm, but an end to end measurement over as long a length as possible, and then a series of over 100 Ic measurements made on a 1-cm scale to determine the critical current homogeneity of the sample. This was accomplished by holding the sample down on a G10 substrate with 100 voltage contacts consisting of 1-cm wide pieces of copper-beryllium finger stock. The finger stock was wired by means of 4 lengths of 25 conductor ribbon cable to a patch panel on which were mounted 50 banana bulkhead connectors. The entire sample and G10 assembly was then immersed in liquid nitrogen. The experimentalist would then do an end to end measurement and then proceed measure the critical current homogeneity of the sample by working their way through the consecutive pairs of connectors on the panel. The first 1-meter long samples measured in this manner had end to end critical currents of between 0.1 and 4 amperes, yet certain sections had critical currents as high as 45 amperes. FIG. 1 shows the critical current homogeneity of two 1-meter long samples.

The inferior sections had to be capable of carrying large currents during the measurement of the superior sections without burning out. Thus increasingly thick layers of silver were deposited to perform as current contacts as well as to carry current over inferior sections during the measurement of the high critical current sections. This occasionally resulted in the destruction of the sample during the measurement. Yet measurements continued in this manner until recently when process improvements resulted in tape being fabricated which carried close to 110 amperes of super current. The present record of an Ic of 125 amperes measured over 100 cm and an Ic of 175 amperes on the same sample measured over 67 ushered in a series of samples for which determination of the homogeneity using the aforementioned method was impossible. These recent increases in critical current capacity have spurred development of a new technique for the characterization of sample homogeneity.

Despite the recent progress in production of superconductive tapes, improvements have been desirable in the measurement of critical current properties.

SUMMARY OF THE INVENTION

To achieve the foregoing and other objects, and in accordance with the purposes of the present invention, as embodied and broadly described herein, the present invention provides an apparatus for measurement of critical current in a superconductive tape including a means for applying a localized magnetic field to a portion of a superconductive tape, a means for measuring critical current of the portion of the superconductive tape subjected to the localized magnetic field, and, a means for positionally locating to specific portions of the superconductive tape both said means for applying a localized magnetic field and said means for measuring critical current.

The present invention further provides a process for measuring critical current in a superconductive tape in a manner capable of determining critical current variations between varying regions of the superconductive tape including applying a localized magnetic field to a first portion of a superconductive tape, measuring critical current of the first portion of the superconductive tape subjected to the localized magnetic field, repositioning said localized magnetic field to a second portion of a superconductive tape, measuring critical current of the second portion of the superconductive tape subjected to the localized magnetic field so as to provide a critical current mapping of multiple portions of the superconductive tape.

DETAILED DESCRIPTION

YBCO films on flexible metallic substrates, coated conductors, have been developed that carry about 30 A at 7 T and 64 K. Thus these materials are approaching the performance levels necessary for commercial applications at liquid nitrogen temperatures. A number of economic and technical obstacles remain, one of which is sample homogeneity. Self-field critical current densities of 1.0 MA/cm$^2$ have been reported on 1-meter long conductors. Measurements made as a function of position on a centimeter length scale however, have shown the critical current to vary by as much as 20% over the length of the same sample. It is the region which carries the least current that determines the end-to-end self-field critical current performance. It is therefore of the utmost importance that positionally dependent measurements be made on coated conductors as a means of locating inferior regions and comparing them with higher critical current regions.

A cryogenic linear positioner has been developed, primarily for use in characterizing coated conductor critical current homogeneity at 75K. In the cryogenic linear positioner, a sample is suspended in liquid nitrogen between a clamp at one end of the positioner and a spring to maintain tension located at the other end. Thus one benefit is that the sample has twice the surface area exposed to the cooling effects of the nitrogen as compared to the previous method. In addition the coated conductor sample passes through two rare earth magnets mounted in split coil geometry with a gap of about 3.2 mm which generate a magnetic field of about 0.6 Tesla (T) over a 0.4 cm length of the sample. Two sliding voltage taps are located on either side of the magnets with a 1.3 cm separation. This tool can also be used to measure the positional dependence of the coated conductor resistance at room temperature, and the room temperature resistance of the underlying YBCO coating without the overlaying protective cover of silver. These results are discussed below and their relation to coated conductor fabrication is demonstrated.

Figure 7:
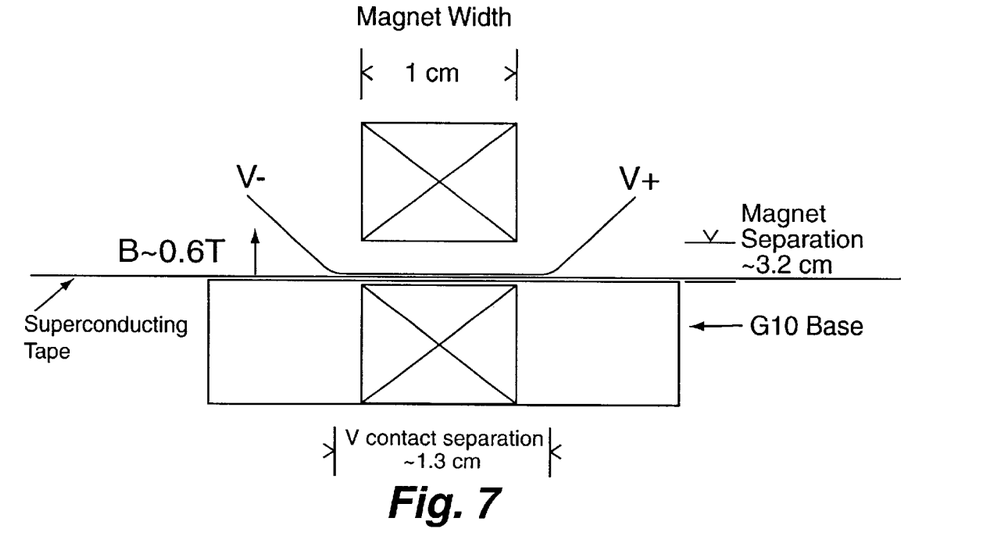
FIG. 7 shows a schematic drawing of a magnet and stage section of the apparatus of the present invention.
Figure 8:
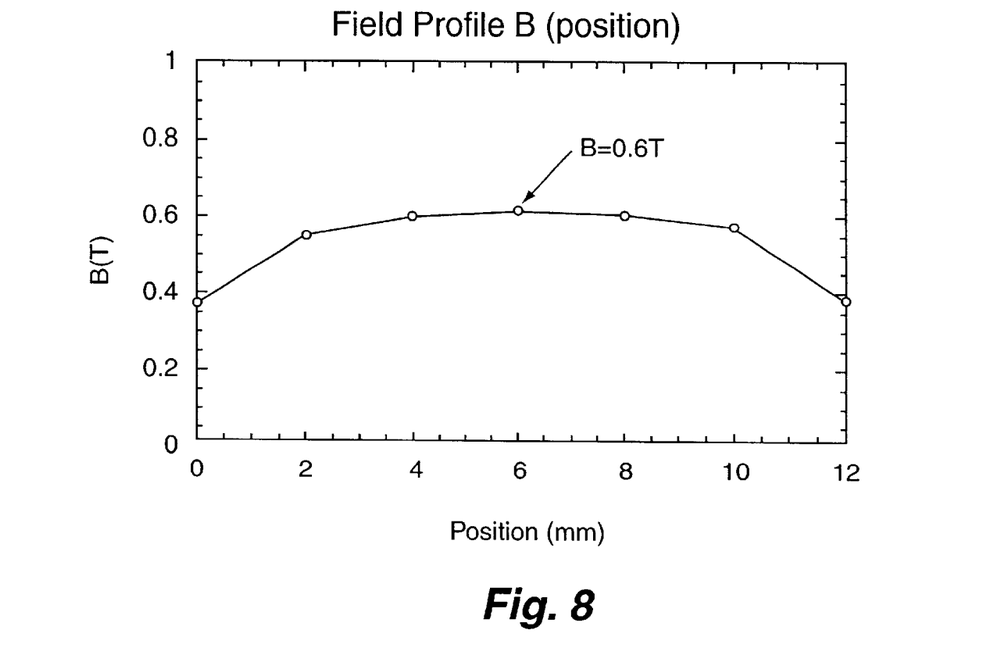
FIG. 8 shows a plot of magnetic field profile seen by a superconductive tape during the measurements in accordance with the present invention.

More specifically, the apparatus consists of a 1.5-meter long linear translator built for cryogenic operation with a stepper motor mounted at the room temperature end, attached to a length of brass all-thread rod 10 (linear thread density of 6.3 threads per centimeter). A stage 11 consisting of a piece of G-10 (a fiber-glass and epoxy material commonly used in low temperature physics) threaded to fit the all-thread rod contains a pair of rare-earth magnets 12 and a pair of voltage contacts 14 located one on either side of the magnets 12. During the experiment, current is ramped through the entire sample while a voltage is measured across the length of sample 16 between the voltage contacts 14 which is where the magnetic field produced by the magnets 12 is highest. Sample 16 is suspended in liquid nitrogen 18 in container 20.

The two core principles that this technique relies upon are: (1) an applied magnetic field suppresses the Ic of a superconductor; and, (2) measurement of Ic in an applied field reflects sample performance in zero field.

It is in this manner that the local critical current of the sample is suppressed from 4 to 7 times below Ic self field and inferior regions of the sample are prevented from destruction during the measurement of superior regions.

On some 1-meter samples, the self field critical current has been characterized by removing the magnets thus allowing the comparison of self field Ic to in-field Ic. These results are presented first. Second, measurement of the positionally dependent resistance of the YBCO itself on 1-meter coated conductor after positionally dependent 75 K, 0.6 T critical current measurements were done. Third, a coated conductor was fabricated, the Ic in 0.6 T was measured, the sample was stripped of both silver and YBCO, YBCO and silver were deposited on the IBAD template and the sample was characterized. Finally, the importance of the characterization of the room temperature resistance of a 1-meter sample is shown by comparing its positional dependence of resistance to Ic measurements made in field.

The resolution in the present invention can be controlled as well. The in-field Ic resolution is determined by two parameters: the magnetic field profile as it varies along the length of the tape; and, the distance separating the voltage taps. Both methods are discussed in order below.

Figure 9:
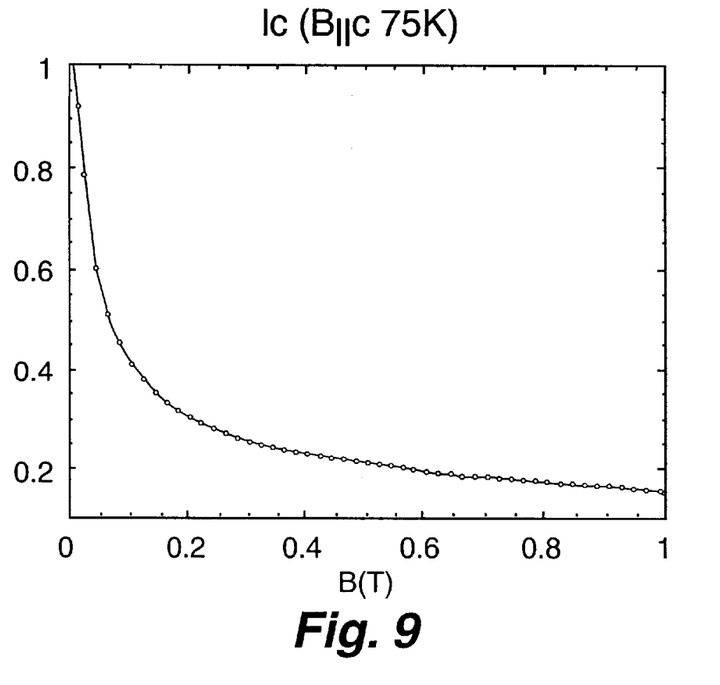
FIG. 9 shows typical critical current dependence of applied magnetic field at 75K with the field oriented parallel to the normal vector to the tape plane.
Figure 10:
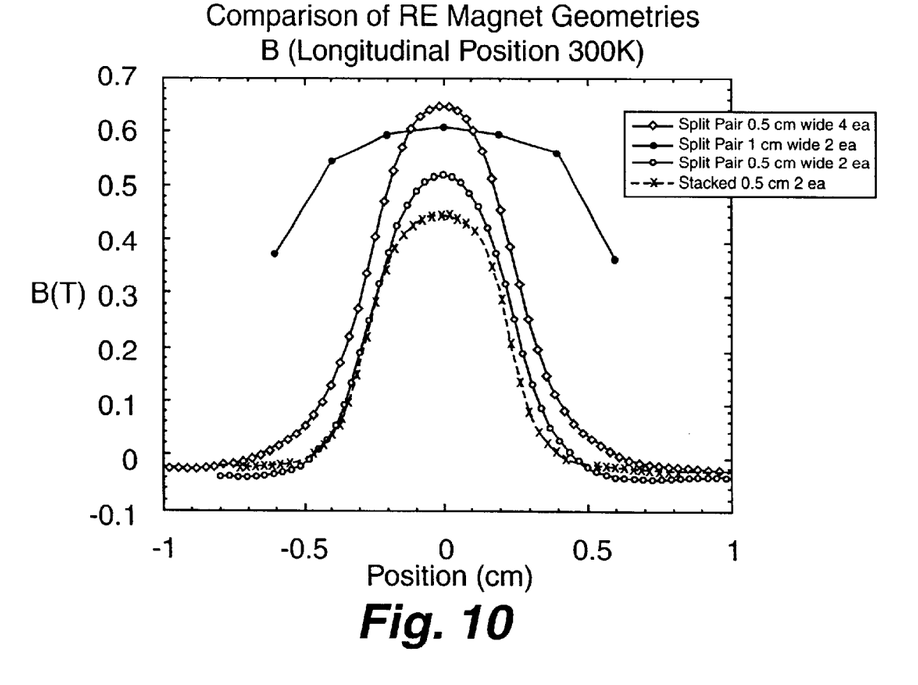
FIG. 10 shows an expanded view of the 0–1 Tesla region where the positional dependence of Ic resulting from the application of a magnetic field varying along the tape length is plotted for a superconducting tape sample with no variation in Ic as a function of length.
Figure 11:
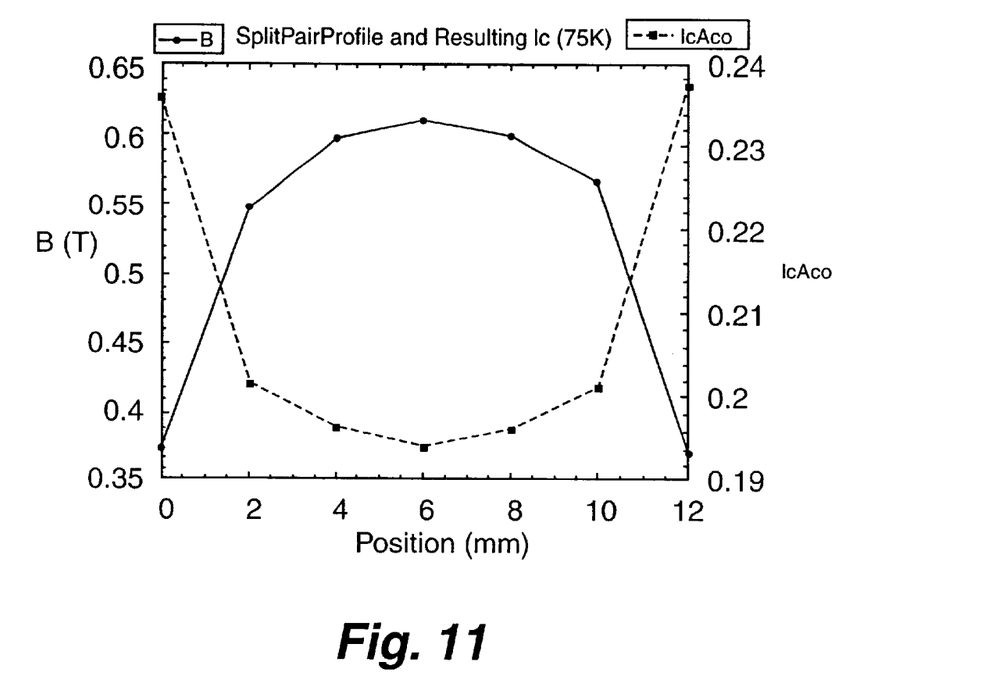
FIG. 11 shows a plot of magnetic field profile (and resulting Ic) seen by a superconductive tape during the measurements in accordance with the present invention using a split pair configuration.

The measurement technique uses a magnetic field generated by rare earth magnets in split pair geometry to locally suppress the critical current, Ic, of the segment being measured below that of the surrounding tape in order not to destroy these surrounding areas should they have lower Ics than the segment being measured. FIG. 9 shows a typical critical current dependence of applied magnetic field at 75K with the field oriented parallel to the normal vector to the tape plane. FIG. 10 shows an expanded view of the 0–1 Tesla region. Assuming a superconducting tape sample with no variation in Ic as a function of length, the positional dependence of Ic resulting from the application of a magnetic field varying along the tape length is plotted in FIG. 11 using the data from FIG. 10. From this it can be seen that by increasing the sharpness of the field variation on can increase the local suppression of Ic and increase the spatial resolution of the measurement. The resulting variations in the magnetic field profile were measured after assembling combinations of various rare earth magnets.

Figure 12:
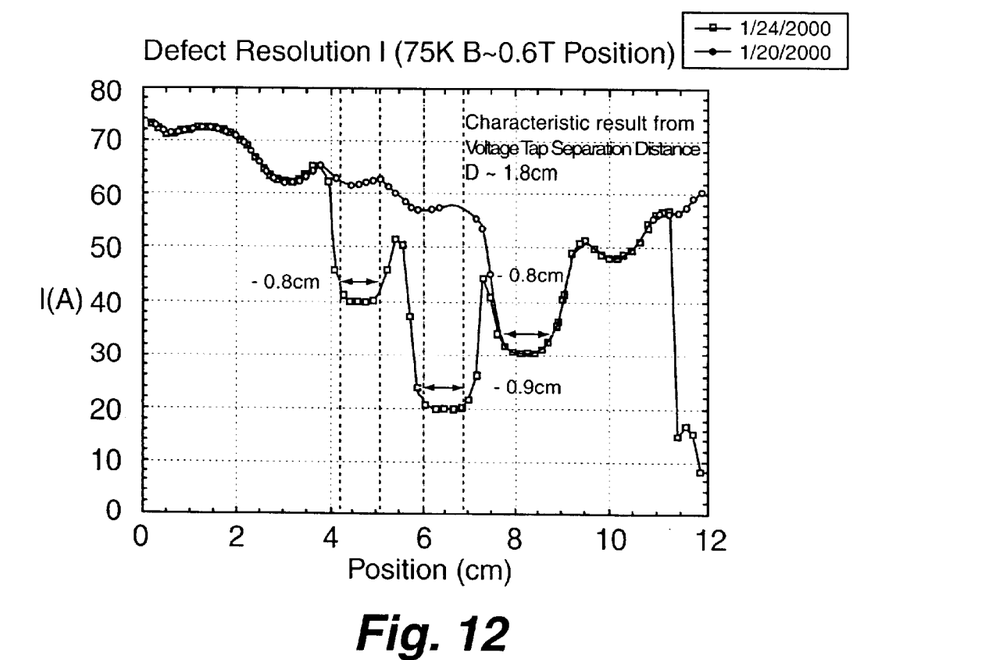
FIG. 12 shows the distance profile of the damaged sections is related to the voltage tap separation.

Generally, the voltage contacts have been separated by a distance of approximately 1.8 cm. By identifying damaged sections of superconducting coated conductor tape and measuring the homogeneity of the sample as a function of position, it has been demonstrated that for sections containing material with Ic's lower than the suppressed Ic's due to the magnetic field, it is the voltage tap separation distance which determines the measurement resolution. This can be seen in FIG. 12 where the distance profile of the damaged sections is exactly that of the voltage tap separation. Thus to increase the measurement resolution and isolate these small sections of low Ic material, one simply needs to relocate the voltage taps closer together.

Finally, mention is made of the ability to perform a two dimensional measurement through the movement of small magnetic field across an superconducting sample while measuring critical current.

The present invention is more particularly described in the following examples which are intended as illustrative only, since numerous modifications and variations will be apparent to those skilled in the art.

EXAMPLE 1

Coated-conductor tapes were prepared by continuous processing using Inconel 625 as the base substrate. The tape was polished, and a biaxially-textured layer of yttria-stabilized zirconia (YSZ) was deposited using an ion-assist gun. Additional buffer layers and the YBCO were deposited using pulsed-laser deposition (PLD). The tape was finally coated with from about 1 to about 3 $\mu$m of silver by magnetron sputtering to protect the YBCO and to lower the contact resistance of the electrical connections. The final sample was one meter long and 1 cm wide.

Figure 2:
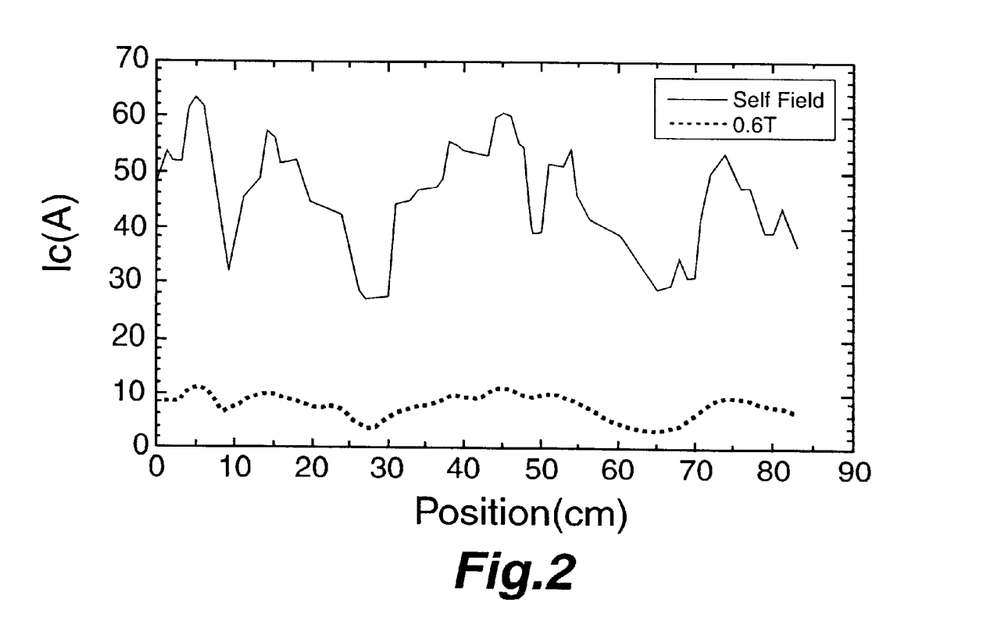
FIG. 2 shows results from measurements both for Ic in self field and Ic in 0.6 T.

In preparation for electrical characterization of in-field critical current homogeneity, indium current leads covering an approximate area of 1 cm$^2$ each were soldered to the tape ends. The sample was mounted on the cryogenic linear positioner as described above. A previously characterized 1-meter sample with significant variations in self field Ic was chosen for the initial measurements using the translator. It was known in advance that Ic self field measurements would not result in sample damage. Results from measurements both in Ic in self field and Ic in 0.6 T are plotted in FIG. 2.

Inspection of these curves is best accomplished by plotting the data sets on their own y-axis. Thus in FIG. 3, the self field data was plotted on the left hand y-axis, and the in field data was plotted on the right hand y-axis.

Figure 3:
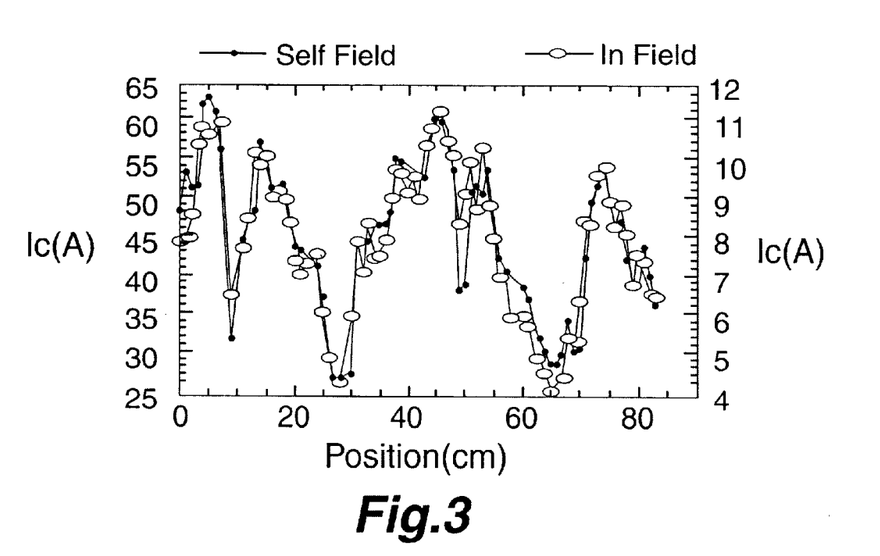
FIG. 3 shows self field critical current measurements correlate closely with 0.6 T critical current measurements.
Figure 4:
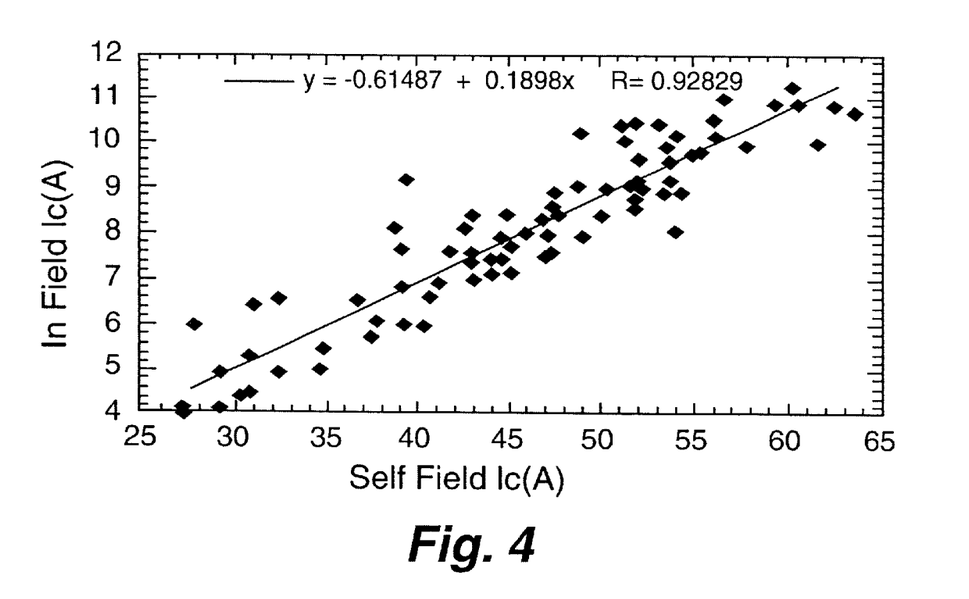
FIG. 4 shows the 0.6 T in-field critical current is an increasing function of the self field critical current.

Visual inspection of FIG. 3 shows the close correlation between Ic self field, and Ic in 0.6 T as a function of position. The features present in each curve correlate closely, as well as the positionally dependent comparative rate of change in Ic. This correlation is more obvious when Ic in 0.6 T versus Ic self field is plotted after sorting the self field data in ascending order as seen in FIG. 4. Thus it could be asked and determined whether two or more sections of tape with a given self field critical current have the same field dependence.

Ultimately any high temperature superconductor fabrication process must address the field dependence of critical current. It is economically unfeasible to characterize the field dependence of long lengths completely. This type of measurement is quite easily done at one field. One can pick a given self field Ic say, about 45 amperes. Tracing a line perpendicular to the x axis through the data one can see that for 45 amperes, the variation in field dependence on this particular 1-meter sample is between 7.8+/−0.45 amperes. Thus the effect of 0.6 T on self field Ic at 45 amperes is to suppress it by between 5.4 and 6.2 times. This range varies slightly over the range values for Ic on this sample.

EXAMPLE 2

Figure 5:
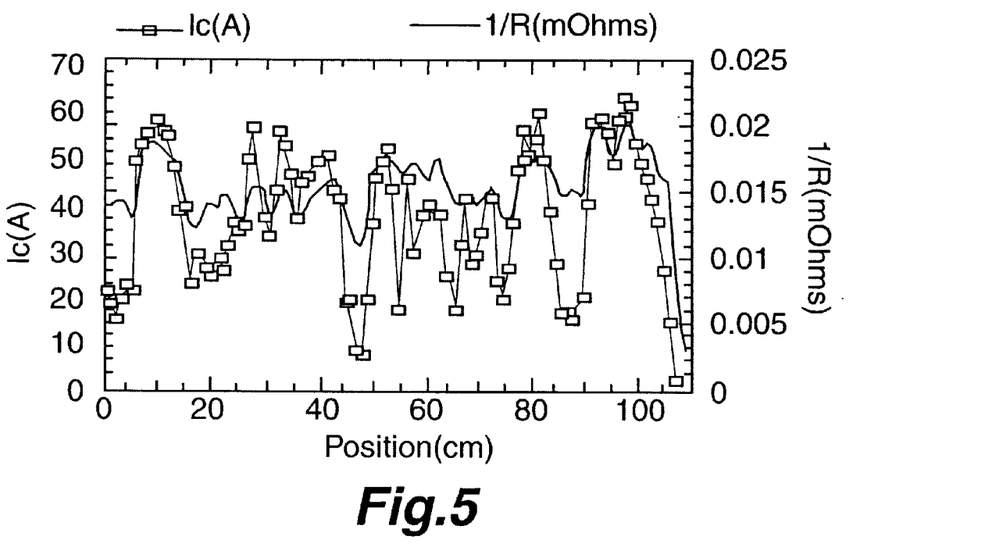
FIG. 5 shows there is a close correlation between the positional dependence of the critical current and the room temperature conductivity of the YBCO for this 1-meter coated conductor

In another experiment, a 1-meter YBCO coated conductor was fabricated with techniques described above. The cryogenic positioner was then used to measure the Ic in 0.6 T as a function of position. The sample was stripped of silver by immersion in a dilute bath of hydrogen peroxide and ammonium hydroxide. The positioner was used to make room temperature resistance measurements as a function of position. The electrical conductivity is the inverse of resistance and an analog of Ic. In FIG. 5, the Ic's at 75 K under 0.6 T are plotted on the left hand y axis and the conductivity of the YBCO plotted on the right hand y axis. The x axis is the distance down the sample in centimeters.

The conductivity of the YBCO was measured in a manner similar to that of the Ic. The current leads were left on the ends of the sample during the process of stripping the silver coating, and the sample was mounted on the cryogenic positioner, as previously described. During the 300 K measurements, current ranging to 0.01 amperes was ramped through the sample and the voltage drop across the taps spaced 1.3 cm apart was recorded. After each current ramp, the stage was moved 1 cm and another V(I) curve was taken. The data was analyzed by taking an arbitrary voltage drop of about 125 $\mu$V as the voltage criterion, the current necessary to generate this voltage was the analyzed result. The resistance was then calculated, and the inverse was plotted, or the conductance above.

The significance of this measurement lies in considering the nature of the resistivity of high temperature superconductors in comparison to normal metals. High purity normal metals, have very low resistivities for example, copper, has a resistivity of about 1.68 $\mu$Ohm-cm. Microscopic impurities in these metals such as those needed to convert the materials into alloys such as brass, result in an increase the resistance of the material. In contrast micro-bridges of YBCO have room temperature resistivities 200 times higher than copper. Knowledge of their superconducting properties, such as the ability to carry currents at high magnetic fields, tells us that they have lots of microscopic defects. Thus, in this material, which is known by nature as highly resistive in the normal state, there is a high degree of correlation between increases in resistance and decreases in superconducting properties. It is therefore concluded that the cause of this must be gross defects such as cracks or thickness variations or even large angle grain boundaries are known as a hindrance to superconducting properties. It is furthermore expected that process improvements should result in the elimination of these positional variations in resistance at which point it should be the microscopic defects alone which control the superconducting properties.

EXAMPLE 3

Figure 6:
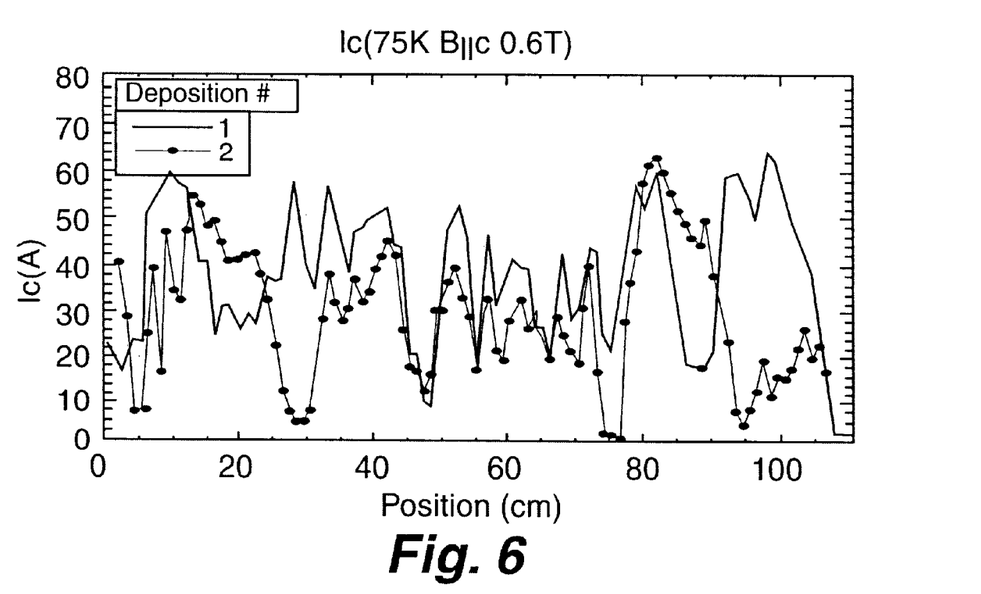
FIG. 6 shows repeat depositions on the IBAD template result in a close correlation of the positional dependence of Ic at 75 K in 0.6 T. This indicates the importance of the template in affecting superconducting performance.

In another experiment using the positioning device of the present invention, it was sought to determine whether the IBAD YSZ template affects the superconducting properties of the YBCO. A random sample of YBCO coated conductor was chosen and Ic at 75 K in 0.6 T was measured along its length at 1 cm intervals using the positioner previously mentioned. Both the protective silver of the template and the YBCO were then stripped. Additional YBCO, identical both in deposition technique and in thickness, was deposited and a new protective layer of silver identical in thickness to the previous one was deposited. Again Ic in 0.6 T at 75 K was measured as above and the results are plotted in FIG. 6.

Although the present invention has been described with reference to specific details, it is not intended that such details should be regarded as limitations upon the scope of the invention, except as and to the extent that they are included in the accompanying claims.

What is claimed is:

1. An apparatus for measurement of critical current in a superconductive tape comprising:
   a means for applying a localized magnetic field to a portion of a superconductive tape;
   a means for measuring critical current of the portion of the superconductive tape subjected to the localized magnetic field, said means including sliding voltage taps; and,
   a means for positionally locating to specific portions of the superconductive tape both said means for applying a localized magnetic field and said means for measuring critical current.

2. The apparatus of claim 1 further including a means for cooling said apparatus to a temperature below the superconducting temperature of a superconductive tape.

3. The apparatus of claim 1 wherein said means for positionally locating to specific portions of the superconductive tape both said means for applying a localized magnetic field and said means for measuring critical current includes a means for moving the superconductive tape in relationship to said means for applying a localized magnetic field and said means for measuring critical current.

4. The apparatus of claim 2 wherein said means for positionally locating to specific portions of the superconductive tape both said means for applying a localized magnetic field and said means for measuring critical current includes a means for moving the superconductive tape in relationship to said means for applying a localized magnetic field and said means for measuring critical current.

5. The apparatus of claim 1 wherein said means for positionally locating to specific portions of the superconductive tape both said means for applying a localized magnetic field and said means for measuring critical current includes a means for moving said means for applying a localized magnetic field and said means for measuring critical current in relationship to the superconductive tape.

6. The apparatus of claim 2 wherein said means for positionally locating to specific portions of the superconductive tape both said means for applying a localized magnetic field and said means for measuring critical current includes a means for moving said means for applying a localized magnetic field and said means for measuring critical current in relationship to the superconductive tape.

7. The apparatus of claim 1 wherein said means for applying a localized magnetic field is rare earth magnets.

8. A process for measuring critical current in a superconductive tape in a manner capable of determining critical current variations between varying regions of the superconductive tape comprising:
   applying a localized magnetic field to a first portion of a superconductive tape;
   measuring critical current of the first portion of the superconductive tape subjected to the localized magnetic field through sliding voltage taps;
   repositioning said localized magnetic field to a second portion of a superconductive tape;
   measuring critical current of the second portion of the superconductive tape subjected to the localized magnetic field so as to provide a critical current mapping of multiple portions of the superconductive tape.

9. The process of claim 8 wherein said localized field is applied by rare earth magnets.

* * * * *